(12) United States Patent
Umezawa et al.

(10) Patent No.: US 8,432,744 B2
(45) Date of Patent: Apr. 30, 2013

(54) SEMICONDUCTOR STORAGE DEVICE WITH A WELL CONTROL CIRCUIT

(75) Inventors: Akira Umezawa, Tokyo (JP); Noriyasu Kumazaki, Kawasaki (JP); Daisuke Arizono, Yokohama (JP); Mami Kakoi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 205 days.

(21) Appl. No.: 13/053,839

(22) Filed: Mar. 22, 2011

(65) Prior Publication Data
US 2011/0249506 A1 Oct. 13, 2011

(30) Foreign Application Priority Data
Apr. 9, 2010 (JP) .................................. 2010-90402

(51) Int. Cl.
*G11C 11/34* (2006.01)
*G11C 16/04* (2006.01)
(52) U.S. Cl.
USPC ............ 365/185.27; 365/185.29; 365/185.19; 323/266
(58) Field of Classification Search ............. 365/185.27, 365/185.29, 185.19; 323/266
See application file for complete search history.

(56) References Cited

U.S. PATENT DOCUMENTS

| 5,602,794 | A | * | 2/1997 | Javanifard et al. | 365/226 |
| 6,084,800 | A | * | 7/2000 | Choi et al. | 365/185.23 |
| 6,891,764 | B2 | * | 5/2005 | Li | 365/189.15 |
| 6,894,931 | B2 | | 5/2005 | Yaegashi et al. | |

FOREIGN PATENT DOCUMENTS
JP 2004-23044 1/2004

* cited by examiner

*Primary Examiner* — Tuan T Nguyen
*Assistant Examiner* — Lance Reidlinger
(74) *Attorney, Agent, or Firm* — Oblon, Spivak, McClelland, Maier & Neustadt, L.L.P.

(57) ABSTRACT

A semiconductor storage device according to an embodiment includes multiple memory cells which electrically rewrite data, a well control circuit which outputs an erasure voltage to be applied to a well through an output terminal, a first pump circuit which outputs a voltage set by boosting an input voltage to the output terminal, a second pump circuit which outputs a voltage set by boosting the input voltage to the output terminal and outputs a voltage higher than an output voltage of the first pump circuit, a pump switching detecting circuit which outputs an assist signal to perform a boosting operation on at least one of the first pump circuit and the second pump circuit and an erase pulse control circuit which sets target voltages of the first pump circuit and the second pump circuit, on the basis of setting values to set a target voltage of the erasure voltage.

20 Claims, 14 Drawing Sheets

| DACV | VERA[V] |
|---|---|
| 0 | 6 |
| 1 | 8 |
| 2 | 10 |
| 3 | 12 |
| 4 | 14 |
| 5 | 16 |
| 6 | 18 |
| 7 | 20 |

0–3: DAC "L"
4–7: DAC "H"

FIG. 11

| B<2> | B<1> | B<0> | DACV | VERA[V] |
|---|---|---|---|---|
| 0 | 0 | 0 | 0 | 6 |
| 0 | 0 | 1 | 1 | 8 |
| 0 | 1 | 0 | 2 | 10 |
| 0 | 1 | 1 | 3 | 12 |
| 1 | 0 | 0 | 4 | 14 |
| 1 | 0 | 1 | 5 | 16 |
| 1 | 1 | 0 | 6 | 18 |
| 1 | 1 | 1 | 7 | 20 |

FIG. 12

SEMICONDUCTOR STORAGE DEVICE WITH A WELL CONTROL CIRCUIT

CROSS-REFERENCE TO RELATED APPLICATION

This application is based upon and claims the benefit of priority from the prior Japanese Patent Application No. 2010-90402, filed on Apr. 9, 2010, the entire contents of which are incorporated herein by reference.

BACKGROUND

1. Field

Embodiments described herein relate generally to a semiconductor storage device such as a NAND-type flash memory having a pump circuit.

2. Background Art

The miniaturization of a semiconductor memory is being progressed concomitantly with the increase in capacity thereof. Particularly, in a NAND-type flash memory, a write/erase count of about 100,000 is required as a reliability specification with respect to a write/erase count of an SD card or a solid state drive (SSD). Due to the miniaturization of the semiconductor memory, the reliability is deteriorated. As one of main factors of deterioration due to the write/erasure operation, electric field stress that is applied to a tunnel oxide film of a memory cell is considered.

In the NAND-type flash memory, the Fowler-Nordheim (FN) tunnel electric field is applied between a substrate and a floating gate of a memory cell to inject electrons into the floating gate (Program) or extract the electrons (Erase). For example, data of "0" or "1" is associated with a charge state (threshold voltage) of the floating gate and the data is stored in the memory cell.

When the write/erasure operation is repeated, electric field damage is gradually applied to a tunnel oxide film of the memory cell. The electrons that are accumulated in the floating gate come out through a defect of the tunnel oxide film, and a data storage characteristic is deteriorated.

In particular, if the size of the memory cell decreases, a ratio of the magnitude of the defect with respect to an area of the tunnel oxide film increases, and the probability of the data coming out may increase. If the probability of the data coming out may increase, the reliability of a non-volatile memory is deteriorated.

In the NAND-type flash memory according to the conventional art, an erase voltage (FN tunnel electric field) to be increased stepwisely is applied between a control gate and the substrate.

However, in the conventional art, the basic configuration to control switching of a pump circuit to generate the erase voltage is not mentioned.

BRIEF DESCRIPTION OF THE DRAWINGS

FIG. 9 is a waveform showing each signal waveform of switch signals SW1B and SW2B and an output voltage VERA that are input to a low voltage dividing circuit 101a;

FIG. 11 is a table showing an example of a relationship between the output voltage (erase voltage) VERA and the setting value DACV;

FIG. 12 is a table showing an example of a relationship between the output voltage (erase voltage) VERA and the setting value DACV;

DETAILED DESCRIPTION

A semiconductor storage device according to an embodiment includes a plurality of memory cells which electrically rewrite data by controlling the amount of charges accumulated in a floating gate formed on a well through a tunnel insulating film. The semiconductor storage device includes a well control circuit which outputs an erasure voltage to be applied to the well through an output terminal. The semiconductor storage device includes a first pump circuit which outputs a voltage set by boosting an input voltage to the output terminal. The semiconductor storage device includes a second pump circuit which outputs a voltage set by boosting the input voltage to the output terminal and outputs a voltage higher than an output voltage of the first pump circuit. The semiconductor storage device includes a pump switching detecting circuit which outputs an assist signal to perform a boosting operation on at least one of the first pump circuit and the second pump circuit. The semiconductor storage device includes an erase pulse control circuit which sets target voltages of the first pump circuit and the second pump circuit, on the basis of setting values to set a target voltage of the erasure voltage.

In the erasure operation of the memory cell, when the erasure voltage is less than an assist boundary value, the pump switching detecting circuit performs the boosting operation on the first pump circuit using the assist signal and outputs the boosting voltage to the output terminal, and when the erasure voltage is equal to or more than the assist boundary value, the pump switching detecting circuit performs the boosting operation on the second pump circuit using the assist signal and outputs a boosting voltage to the output terminal.

The erasure pulse control circuit sets the target voltages of the first pump circuit and the second pump circuit to be increased stepwisely, on the basis of the setting values.

The well control circuit applies the erasure voltage that is output from the first pump circuit or the second pump circuit to be activated and is increased stepwisely, to the well through the output terminal.

Hereafter, embodiments will be described more specifically with reference to the drawings.

First Embodiment

Figure 1:
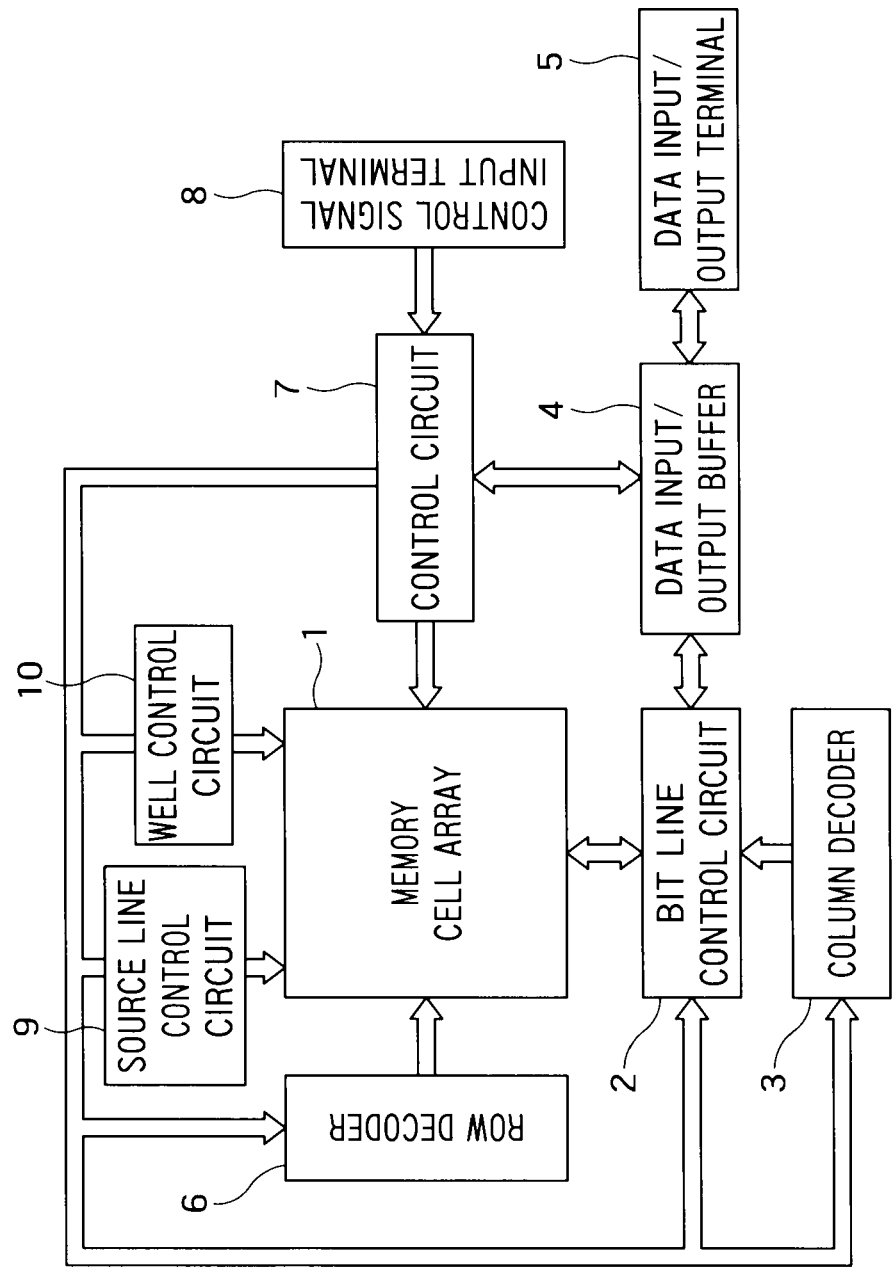
FIG. 1 is a block diagram showing an example of the configuration of a NAND-type flash memory 100 according to a first embodiment.
Figure 2:
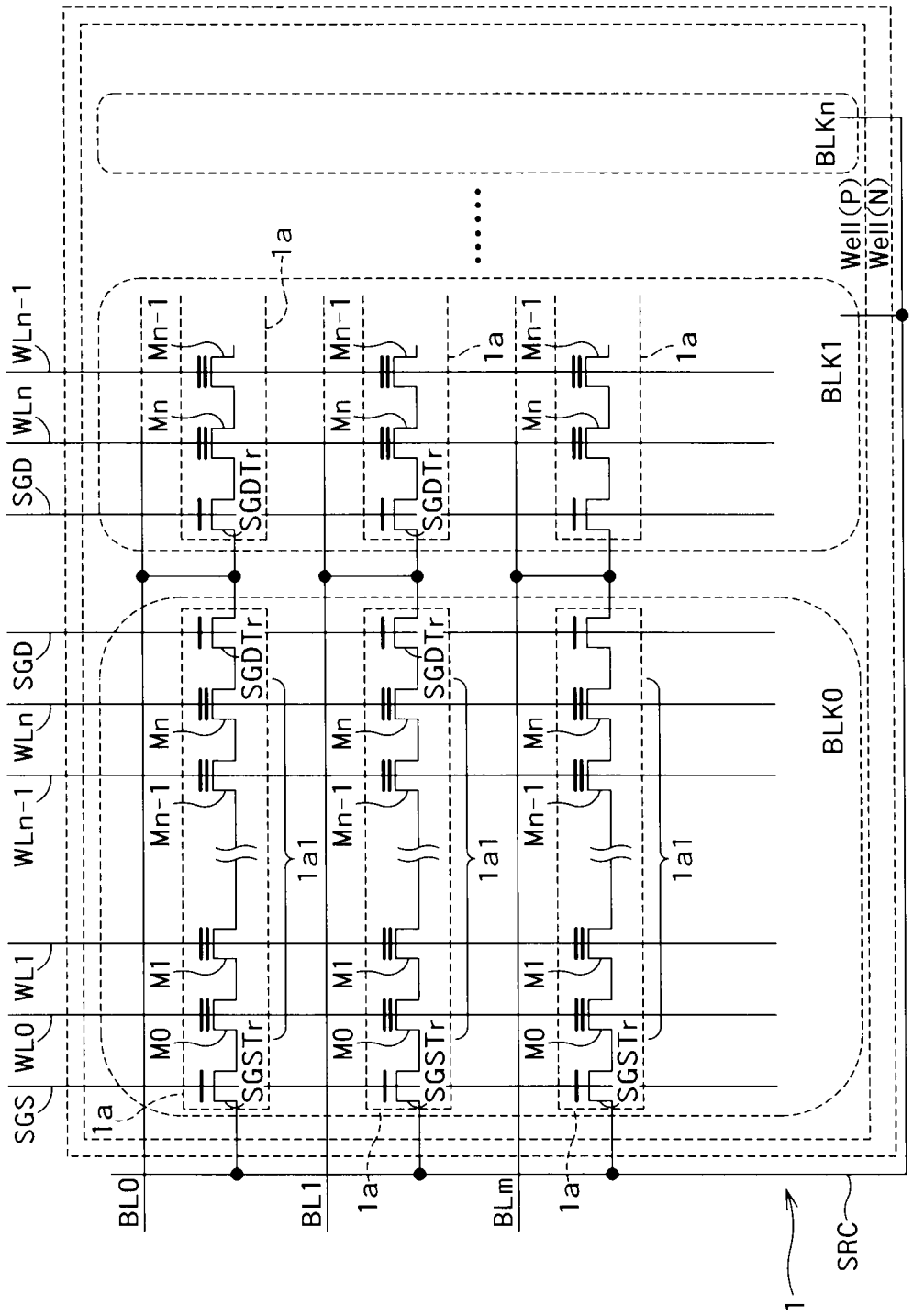
FIG. 2 is a circuit diagram showing an example of the configuration according to the first embodiment that includes a memory cell array 1, a bit line control circuit 2, and a row decoder 6 shown in FIG. 1.

FIG. 1 is a block diagram showing an example of the configuration of a NAND-type flash memory 100 according to a first embodiment. FIG. 2 is a circuit diagram showing an example of the configuration according to the first embodiment that includes a memory cell array 1, a bit line control circuit 2, and a row decoder 6 shown in FIG. 1.

As shown in FIG. 1, the NAND-type flash memory 100 includes a memory cell array 1, a bit line control circuit 2, a column decoder 3, a data input/output buffer 4, a data input/output terminal 5, a row decoder 6, a control circuit 7, a control signal input terminal 8, a source line control circuit 9, and a well control circuit 10.

The memory cell array 1 includes a plurality of bit lines, a plurality of word lines, and a source line. This memory cell array 1 includes a plurality of blocks (BLK0 to BLKn in FIG. 2) in which memory cells, into which data is electrically rewritable, formed from EEPROM cells are disposed in a matrix pattern.

The bit line control circuit 2 used for controlling the voltages of bit lines and the row decoder 6 used for controlling the voltages of the word lines are connected to this memory cell array 1. In a write operation of data, one block is selected by the row decoder 6, and the other blocks are in a non-selection state.

This bit line control circuit 2 reads data of a memory cell of the memory cell array 1 through the bit line, detects the status of the memory cell through the bit line, or writes data into the memory cell by applying a write control voltage to the memory cell through the bit line.

In addition, the bit line control circuit 2, the column decoder 3 and the data input/output buffer 4 are connected. The data storage circuit disposed inside the bit line control circuit 2 is selected by the column decoder 3, and the data of the memory cell that is read out by the data storage circuit is output to the outside thereof from the data input/output terminal 5 through the data input/output buffer 4.

In addition, write data input from the outside to the data input/output terminal 5 is stored in the data storage circuit that is selected by the column decoder 3 through the data input/output buffer 4. From the data input/output terminal 5, various commands such as a write, a read, an erase, and a status read and an address other than the write data are also input.

The row decoder 6 is connected to the memory cell array 1. This row decoder 6 applies a voltage that is necessary for read, write, or erase to a word line of the memory cell array 1.

The source line control circuit 9 is connected to the memory cell array 1. This source line control circuit 9 is configured so as to control the voltage of the source line SRC.

The well control circuit 10 is connected to the memory cell array 1. This well control circuit 10 is configured so as to control the voltage of a semiconductor substrate (well) in which the memory cells are formed.

The control circuit 7 is configured so as to control the memory cell array 1, the bit line control circuit 2, the column decoder 3, the data input/output buffer 4, the row decoder 6, the source line control circuit 9, and the well control circuit 10. That is, the control circuit 7 has a function of generally controlling the overall operation of the NAND-type flash memory 100.

Here, a voltage booster circuit (not shown) that raises the voltage of a power source voltage is assumed to be included in the control circuit 7. The control circuit 7 is configured so as to raise the voltage of the power source voltage as necessary by using the voltage booster circuit and supply a resultant voltage to the bit line control circuit 2, the column decoder 3, the data input/output buffer 4, the row decoder 6, the source line control circuit 9, and the well control circuit 10.

This control circuit 7 controls operation according to control signals (a command latch enable signal CLE, an address latch enable signal ALE, a ready/busy signal RY/BY, or the like) that are input from the outside through the control signal input terminal 8 and a command that is input from the data input/output terminal 5 through the data input/output buffer 4. In other words, when data is programmed, verified, read, and erased according to the control signals and the command, the control circuit 7 generates a desired voltage and supplies the resultant voltage to each portion of the memory cell array 1.

Here, as shown in FIG. 2, the memory cell array 1 has blocks BLK0 to BLKn each configured by connecting a plurality of NAND cell units 1a. The blocks BLK0 to BLKn are formed in a p well Well (p) that is formed in an n well Well (n) of the semiconductor substrate.

The NAND cell unit 1a is configured by a plurality of (n+1 (for example, 64)) memory cells M0 to Mn, which are connected in series, configuring a NAND string, a drain-side selection MOS transistor SGDTr, and a source-side selection MOS transistor SGSTr. In addition, the drain-side selection MOS transistor SGDTr is connected to the bit line and the source-side selection MOS transistor SGSTr is connected to the source line SRC. Here, the source-side selection gate transistor SGSTr and the drain-side selection gate transistor SGDTr are n-type MOS transistors.

A control gate of the memory cells M0 to Mn disposed in each row is connected to the word lines WL0 to WLn.

The bit lines BL0 to BLm are disposed so as to run perpendicular to the word lines WL0 to WLn and the source line SRC.

In addition, the gate of the drain-side selection MOS transistor SGDTr is connected to a drain-side selection gate line SGD. The drain-side selection gate transistor SGDTr is connected between one end of the NAND string 1a1 and the respective bit lines BL0 to BLm.

In addition, the gate of the source-side selection MOS transistor SGSTr is connected to a source-side selection gate line SGS. The source-side selection gate transistor SGSTr is connected between the other end of the NAND string 1a1 and the source line SRC.

The row decoder 6 selects the individual blocks BLK0 to BLKn of the memory cell array 1 and controls a write/read operation on the selected blocks. That is, the row decoder 6 controls a voltage that is applied to a drain-side selection gate line and a source-side gate line, controls a voltage that is applied to a word line (control gate of the memory cell), and selects the memory cell.

Figure 3:
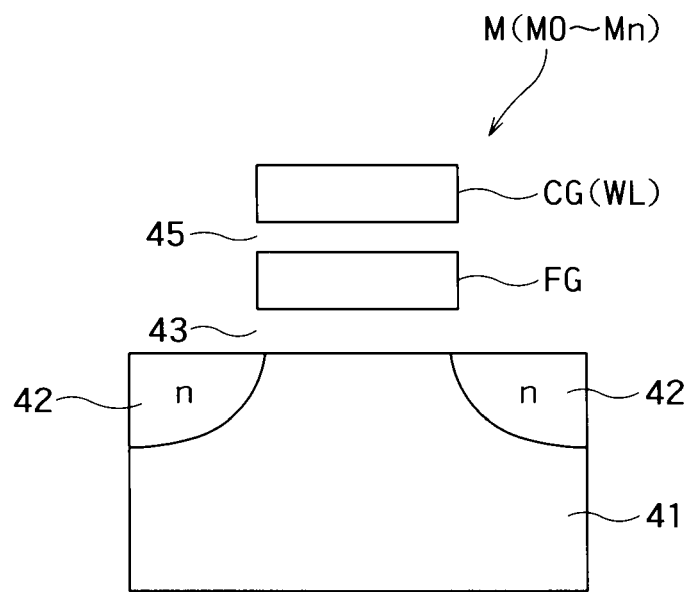
FIG. 3 is a cross-sectional view showing one memory cell of the memory cell array 1 shown in FIG. 2.

Here, FIG. 3 is a cross-sectional view showing one memory cell of the memory cell array 1 shown in FIG. 2.

As shown in FIG. 3, the memory cell M (M0 to Mn) has a charge accumulation layer (for example, a floating gate FG), a control gate CG, and a diffusion layer 42. The control gate CG is electrically connected to the word line WL and is common to the plurality of the memory cells M0 to Mn.

In a well (here, a p well) 41 formed in the semiconductor substrate, a diffusion layer 42 that becomes a source-drain diffusion layer (here, an n+ diffusion layer) of the memory cell M is formed. In addition, a floating gate FG is formed on the well 41 with a gate insulating film (tunnel insulating layer) 43 interposed therebetween. A control gate CG is formed on the floating gate FG with a gate insulating film 45 interposed therebetween.

This memory cell M is configured such that data is stored therein according to a threshold voltage and the stored data can be electrically rewritten by controlling the threshold voltage. The threshold voltage is determined based on the amount of electric charges that can be accumulated in the floating gate FG. The amount of electric charges accumulated in the floating gate FG can be changed according to a tunnel current passing through a gate insulating film 43.

In other words, when the control gate CG is maintained at a voltage that is sufficiently high with respect to the well 41 and the diffusion layer (the source diffusion layer/the drain diffusion layer) 42, electrons are injected into the floating gate FG through the gate insulating film 43. Accordingly, the threshold voltage of the memory cell M becomes higher (for example, it corresponds to a write state when the stored data is binary).

On the other hand, when the well 41 and the diffusion layer (the source diffusion layer/the drain diffusion layer) 42 are maintained at a voltage that is sufficiently high with respect to the control gate CG, electrons are discharged from the floating gate FG through the gate insulating film 43. Accordingly, the threshold voltage of the memory cell M becomes lower (for example, it corresponds to an erase state when the stored data is binary).

As described above, the memory cell M can rewrite the stored data by controlling the amount of electric charges accumulated in the floating gate FG. Alternatively, the memory cell M may be the MONOS (Metal Oxide Nitride Oxide Silicon) type instead of the floating gate type.

Figure 4:
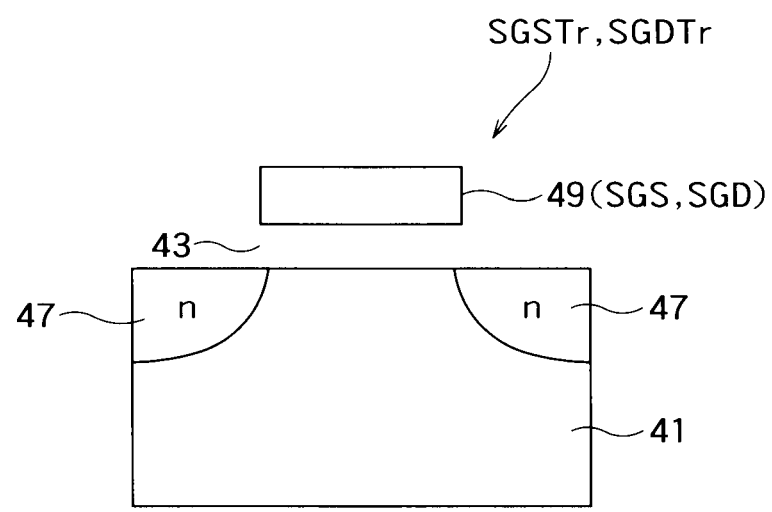
FIG. 4 is a cross-sectional view showing cross sections of the drain-side selection MOS transistor SGDTr, the source-side selection MOS transistor SGSTr of the memory cell array 1 shown in FIG. 2.

FIG. 4 is a cross-sectional view showing cross sections of the drain-side selection MOS transistor SGDTr, the source-side selection MOS transistor SGSTr of the memory cell array 1 shown in FIG. 2.

As shown in FIG. 4, in the well 41, a diffusion layer 47 that becomes a source diffusion layer/drain diffusion layer of the drain-side selection MOS transistor SGDTr and the source-side selection MOS transistor SGSTr is formed. On the well 41, a control gate 49 (SGS and SGD) is formed on the well 41 with a gate insulating film (tunnel insulating layer) 43 interposed therebetween.

Figure 5:
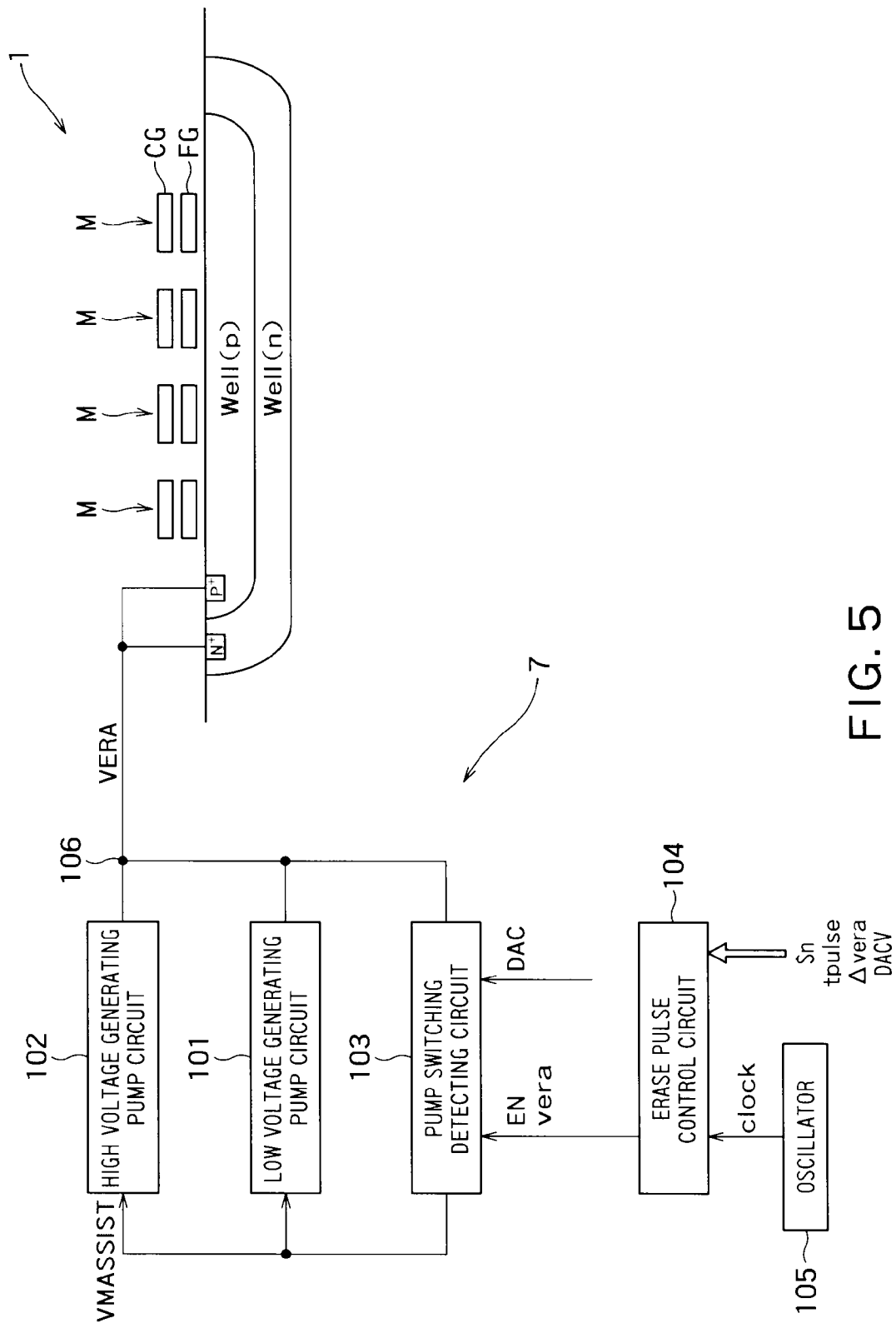
FIG. 5 shows a part of the configuration of a control circuit 7 and a part of a section of a memory cell array 1.

FIG. 5 shows a part of the configuration of a control circuit 7 and a part of a section of a memory cell array 1.

As shown in FIG. 5, the control circuit 7 has a low voltage generating pump circuit (first pump circuit) 101, a high voltage generating pump circuit (second pump circuit) 102, a pump switching detecting circuit 103, an erase pulse control circuit 104, an oscillator 105, and an output terminal 106.

The output terminal 106 outputs an output voltage (erase voltage) VERA to be applied to wells Well (p) and Well (n).

The output voltage (erase voltage) that is output from the output terminal 106 is appropriately controlled by a well control circuit 10 not shown in FIG. 5 and is applied to the wells Well (p) and Well (n).

The low voltage generating pump circuit 101 outputs a voltage set by boosting an input voltage (for example, power supply voltage) to the output terminal 106.

The high voltage generating pump circuit 102 outputs a voltage set by boosting an input voltage (for example, power supply voltage) to the output terminal 106.

The high voltage generating pump circuit 102 can output a voltage that is higher than the voltage output from the low voltage generating pump circuit 101. Meanwhile, the low voltage generating pump circuit 101 is set such that an output current thereof is larger than a current output from the high voltage generating pump circuit 102.

The pump switching detecting circuit 103 outputs an assist signal VMASSIST to perform a boosting operation on at least one of the low voltage generating pump circuit 101 and the high voltage generating pump circuit 102. To the pump switching detecting circuit 103, a digital signal DAC according to a predetermined assist boundary value Va is input.

For example, when the output voltage VERA is less than the assist boundary value Va, the pump switching detecting circuit 103 performs a boosting operation on the low voltage generating pump circuit 101 using the assist signal VMASSIST and outputs a boosting voltage to the output terminal 106. Meanwhile, when the output voltage VERA is equal to or more than the assist boundary value Va, the pump switching detecting circuit 103 performs a boosting operation on the high voltage generating pump circuit 102 using the assist signal VMASSIST and outputs a boosting voltage to the output terminal 106.

The erase pulse control circuit 104 sets target voltages of the low voltage generating pump circuit 101 and the high voltage generating pump circuit 102, on the basis of setting values DACV, Δvera, tpulse, and Sn to set a target voltage of the output voltage VERA.

The setting value DACV is a value used to set (define) the target voltage of the output voltage (erase voltage) VERA to be increased stepwisely. The setting value Δvera is a value used to set the potential difference ΔVERA of the output voltage VERA to be increased stepwisely. The setting value tpulse indicates a period per step when the output voltage VERA is increased stepwisely to a final target voltage. The setting value Sn is the total number of steps (step number) when the output voltage VERA is increased stepwisely.

These setting values DACV, Δvera, tpulse, and Sn are stored in a non-volatile storage element, such as a fuse element.

The oscillator 105 generates a clock signal clock and supplies the clock signal to the erase pulse control circuit 104.

Figure 6:
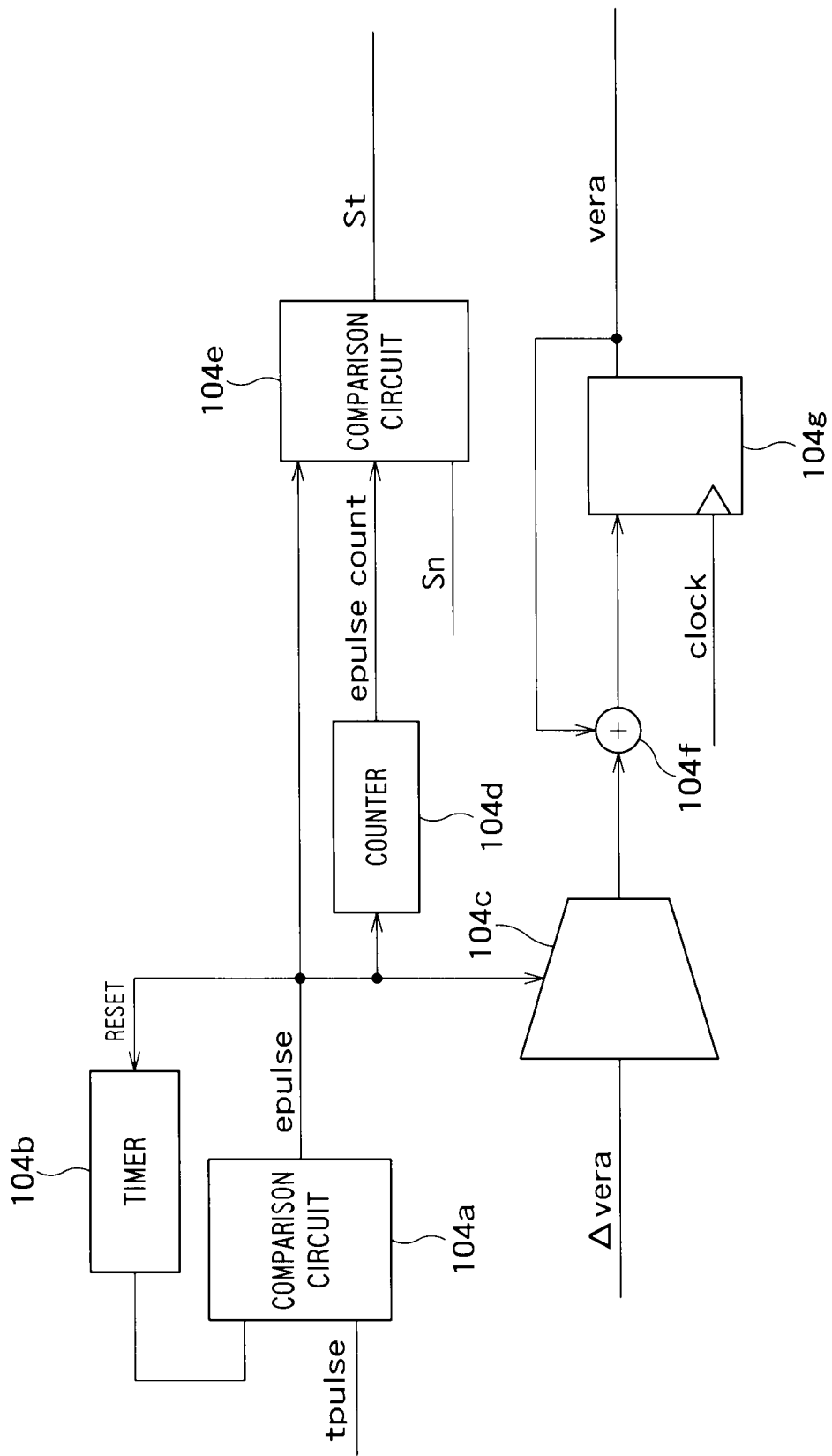
FIG. 6 is a block diagram showing an example of the configuration of the erase pulse control circuit 104 shown in FIG. 5.
Figure 7:
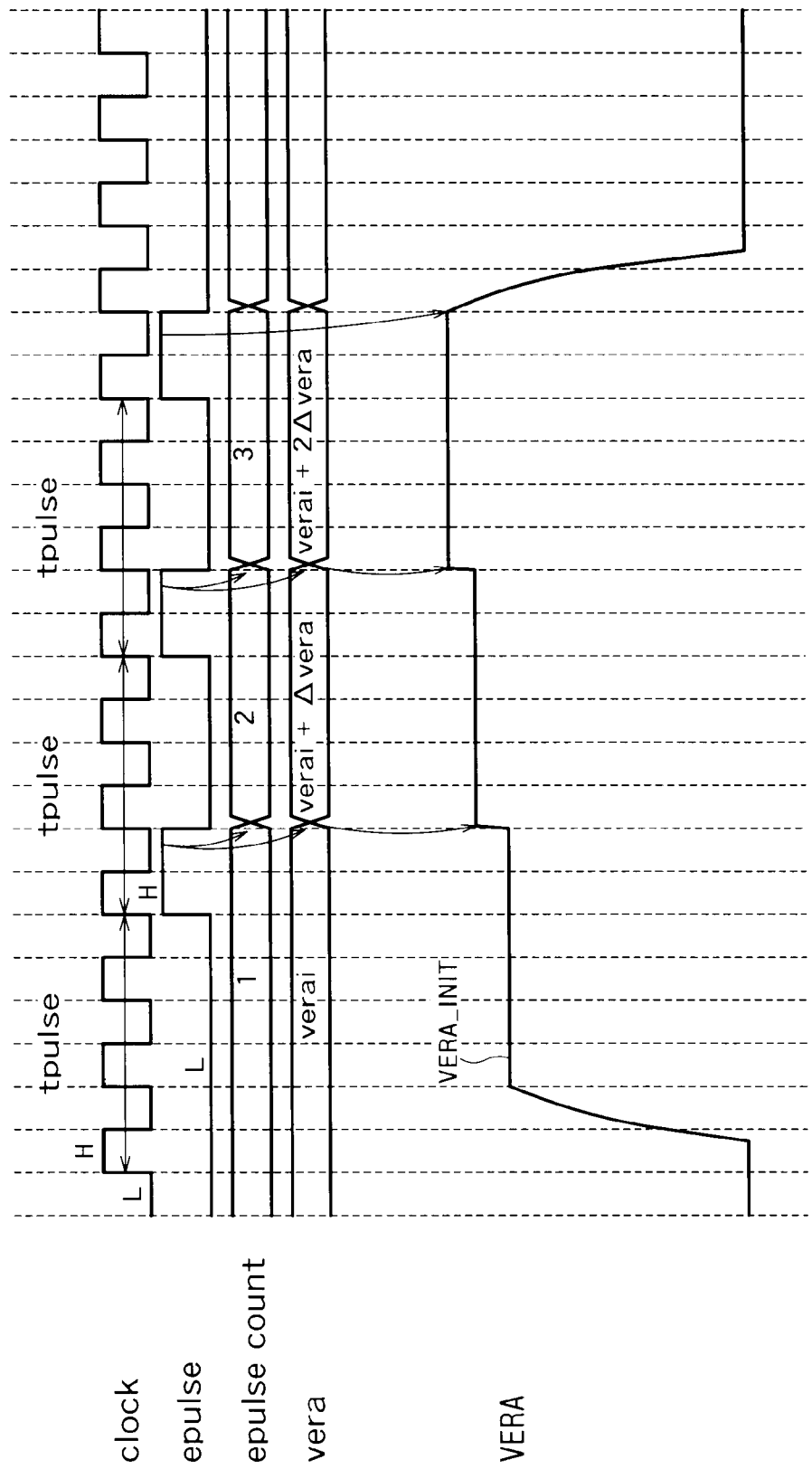
FIG. 7 is a waveform diagram showing an example of a signal waveform of each signal of the erase pulse control circuit 104.

FIG. 6 is a block diagram showing an example of the configuration of the erase pulse control circuit 104 shown in FIG. 5. FIG. 7 is a waveform diagram showing an example of a signal waveform of each signal of the erase pulse control circuit 104.

As shown in FIG. 6, the erase pulse control circuit 104 has a comparison circuit 104a, a timer 104b, a multiplexer 104c, a counter 104d, a comparison circuit 104e, an adder 104f, and a flip-flop circuit (D-type flip-flop circuit) 104g.

The timer 104b counts the clock signal clock and outputs a count value thereof. The timer 104b is reset by a signal epulse ("High" level).

The comparison circuit 104a compares the count value output from the timer 104b and a pulse time tpulse, and outputs the signal epulse ("High" level), when the count value and the pulse time tpulse are matched with each other.

The counter 104d counts the signal epulse ("High" level) and outputs a count value epulse count thereof.

When the count value epulse count is matched with the setting value (step number) Sn, the comparison circuit 104e outputs a signal St to stop a boosting operation of the pump circuits 101 and 102.

For example, in the case where the step number Sn is 3, the comparison circuit 104e outputs the signal St in synchronization with a falling edge of the signal epulse of when the count value epulse count is 3. According to the signal St, the pump circuits 101 and 102 where the boosting operation is performed are inactivated.

The multiplexer 104c outputs a setting value Δvera according to the signal epulse.

The adder 104f adds the control value vera and the setting value Δvera from the multiplexer 104c and outputs an added value.

In the flip-flop circuit 104g, the clock signal clock is input to a C terminal and the operation result (vera+Δvera) of the adder 104f is input to a D terminal. The flip-flop circuit 104g outputs a latched value as a control value vera, in synchronization with the clock signal clock.

In an initial state, the control value vera is set to an initial value verai. Therefore, in the case where the step number Sn is 3, the control value vera finally becomes the initial value verai+the setting value Δvera×2. The initial value verai is a value that is determined by a setting value DACV and corresponds to a first output voltage VERA_INIT.

Figure 8:
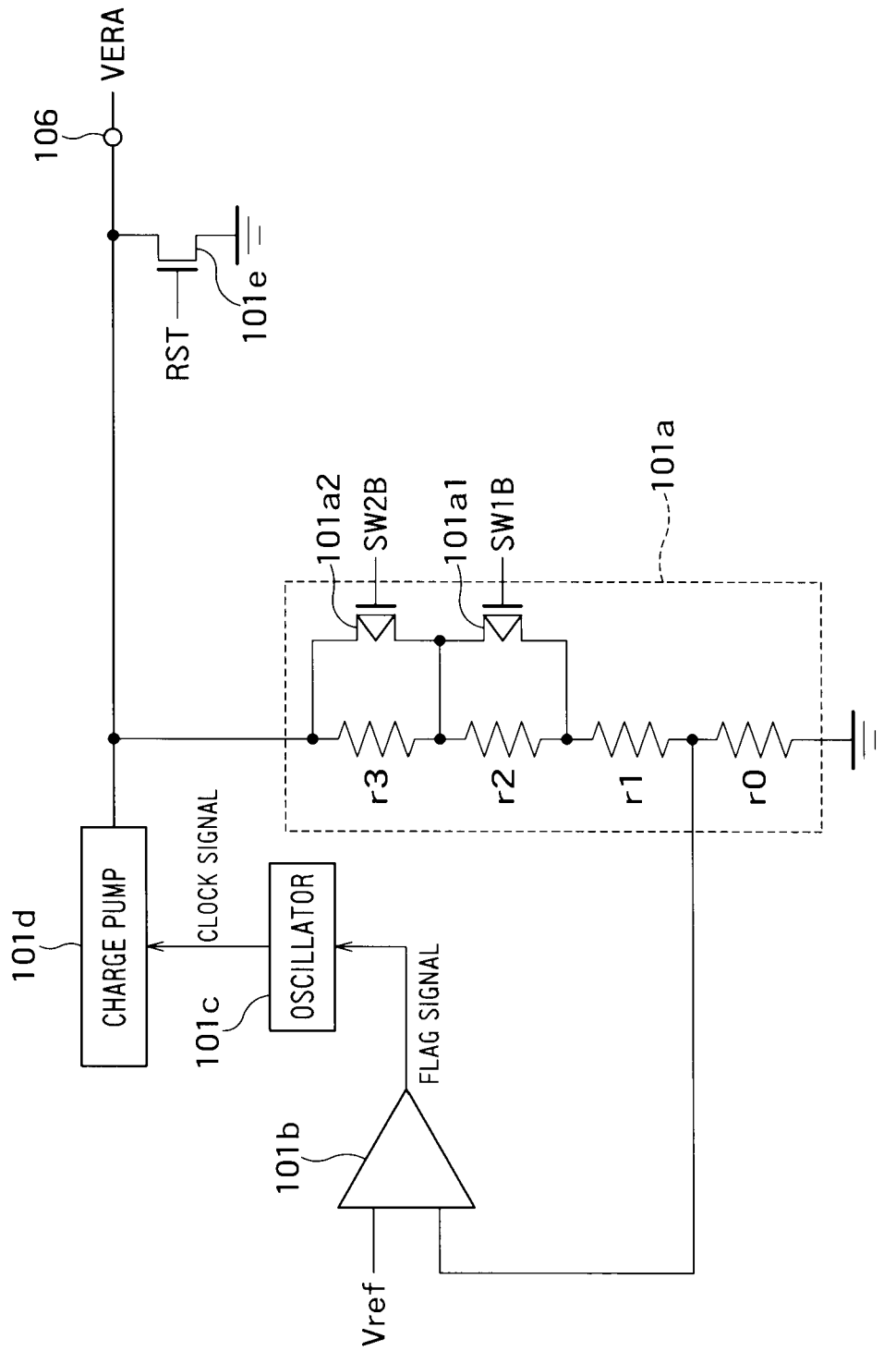
FIG. 8 shows an example of the specific configuration of the low voltage generating pump circuit 101 shown in FIG. 5.
Figure 9:
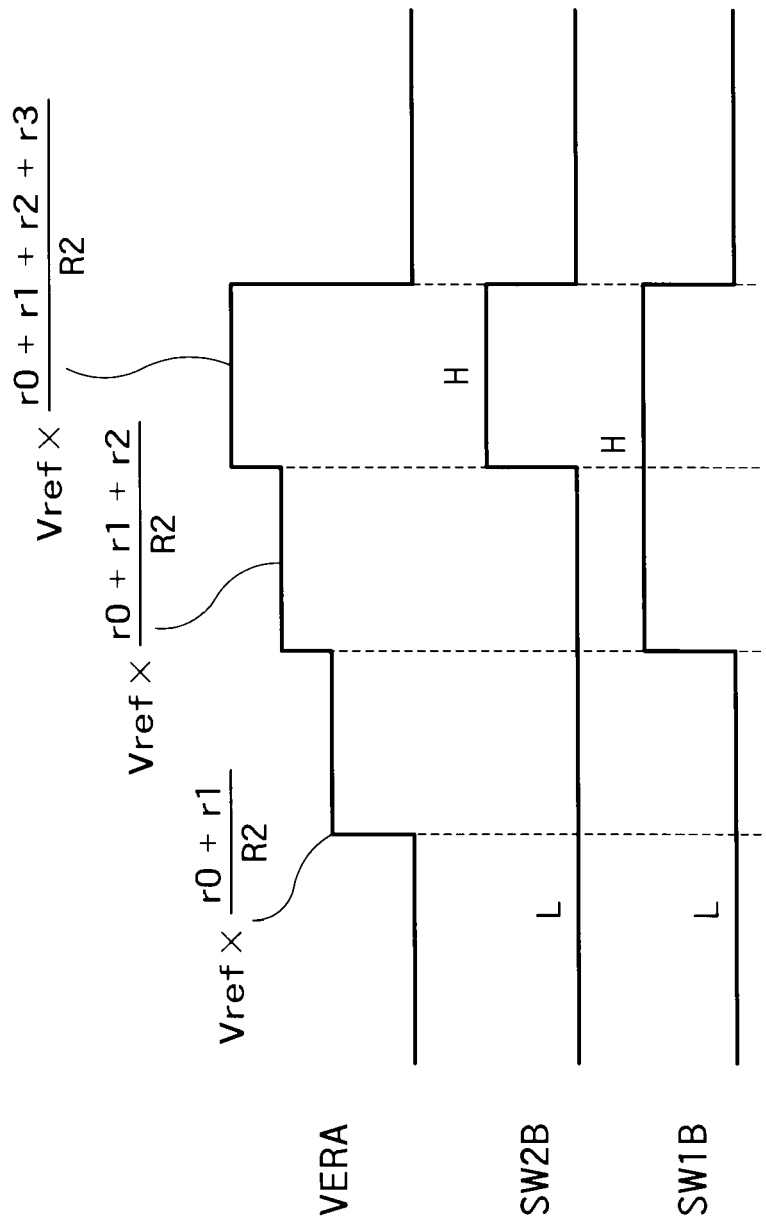

FIG. 8 shows an example of the specific configuration of the low voltage generating pump circuit 101 shown in FIG. 5. FIG. 9 is a waveform showing each signal waveform of switch signals SW1B and SW2B and an output voltage VERA that are input to a low voltage dividing circuit 101a. The high voltage generating pump circuit 102 can be easily configured, similar to the configuration shown in FIG. 5.

As shown in FIG. 8, the low voltage generating pump circuit 101 has a dividing circuit 101a, an amplifier circuit 101b, an oscillator 101c, a charge pump 101d, and a transistor 101e.

The dividing circuit 101a includes resistors that have resistance values r0 to r3 and transistors 101a1 and 101a2, and outputs division voltages of the output voltage VERA. By controlling ON/OFF of the transistors 101a1 and 101a2 by the switching signals SW1B and SW2B according to the control value vera, division ratios of the dividing circuit 101a are controlled as r0/(r0+r1), r0/(r0+r1+r2), and r0(r0+r1+r2+r3).

The amplifier circuit 101b compares outputs of the reference voltage Vref and the dividing circuit 101a and outputs a flag signal according to the comparison result.

The oscillator 101c outputs a clock signal to activate the charge pump 101d, according to the flag signal.

The charge pump 101d is activated by the clock signal and boosts the input voltage and outputs the boosted voltage to the output terminal 106.

The transistor 101e is turned on by a reset signal and changes the potential of the output terminal 106 to the ground potential.

The target value (target voltage) of the output voltage VERA of the low voltage generating pump circuit 101 is controlled stepwisely, such that the division ratios are controlled stepwisely by the switching signals SW1B and SW2B.

Thereby, the output voltage VERA of the low voltage generating pump circuit 101 is controlled to be increased stepwisely (for example, Vref×r0(r0+r1), Vref×r0(r0+r1+r2), Vref×r0/(r0+r1+r2+r3) (refer to FIG. 9). The high voltage generating pump circuit 102 is also controlled in the above-described way.

The dividing circuit 101a may be shared in the low voltage generating pump circuit 101 and the high voltage generating pump circuit 102.

Figure 10:
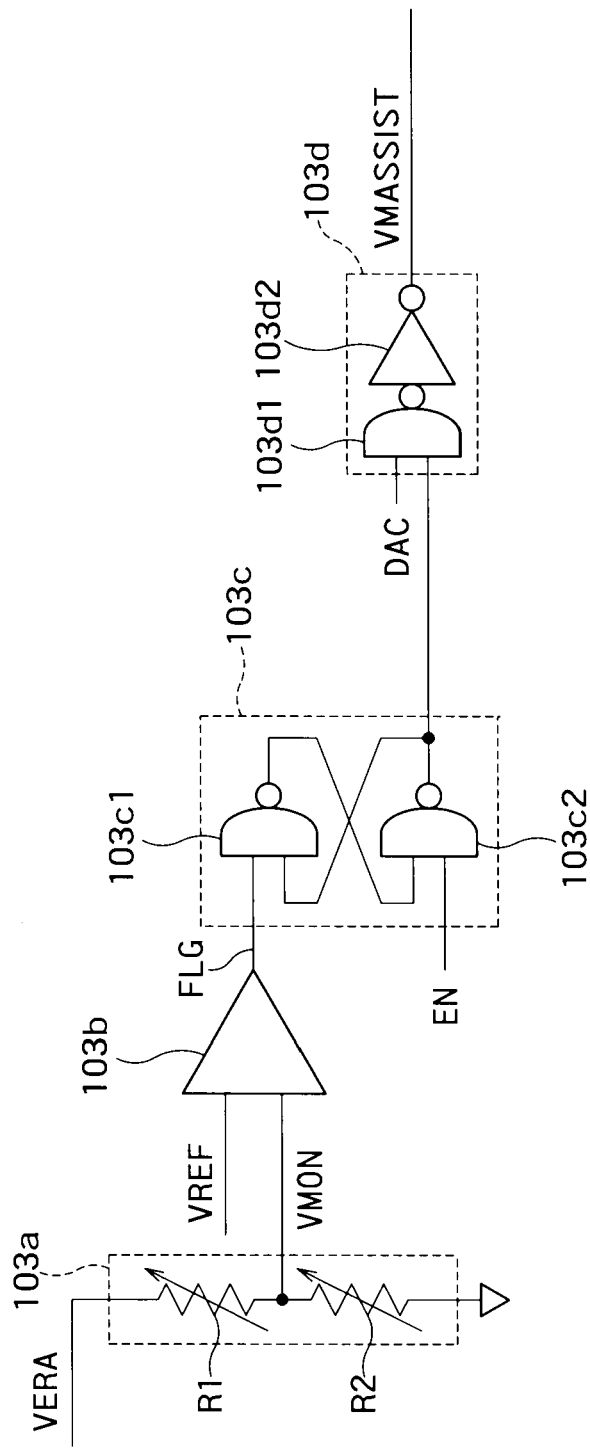
FIG. 10 is a circuit diagram showing an example of the circuit configuration of the pump switching detecting circuit 103 shown in FIG. 5.

FIG. 10 is a circuit diagram showing an example of the circuit configuration of the pump switching detecting circuit 103 shown in FIG. 5. FIG. 11 is a table showing an example of a relationship between the output voltage (erase voltage) VERA and the setting value DACV.

As shown in FIG. 10, the pump charging detecting circuit 103 has a dividing circuit 103a, an amplifier circuit 103b, a flip-flop circuit (SR-type flip-flop circuit) 103c, and a logic circuit 103d.

The dividing circuit 103a outputs a division voltage VMON of the output voltage VERA. The dividing circuit 103a includes resistors R1 and R2 of which resistance values change, and the division ratio that is determined by the resistors R1 and R2 is set according to the assist boundary value Va. That is, the division ratio is set such that the relationship of the reference voltage Vref=the assist boundary value×the division ratio is realized. The division ratio is represented by the resistance R2/(the resistance R1+the resistance R2).

The amplifier circuit 103b compares the division voltage VMON and the reference voltage Vref and outputs a flag signal FLG according to the comparison result. Fore example, when the division voltage VMON is lower than the reference voltage Vref, the amplifier circuit 103b outputs the flag signal FLG being low-level (logic "0"), on the other hand, when the division voltage VMON is higher than the reference voltage Vref, the amplifier circuit 103b outputs the flag signal FLG being high-level (logic "1").

In the flip-flop circuit (SR-type flip-flop circuit) 103c, the flag signal FLG is input to a set terminal and an enable signal EN to start an operation is input to a reset terminal.

The logic circuit 103d outputs an assist signal VMASSIST that is obtained by operating an output of the flip-flop circuit 103c and the digital signal DAC according to the assist boundary value Va.

The logic circuit 103d includes a NAND circuit 103d1 to which outputs of the digital signal DAC and the flip-flop circuit 103c are input and an inverter 103d2 to which an output of the NAND circuit 103d1 is input and which outputs the assist signal VMASSIST.

For example, if the assist boundary value Va is set to 14 V, a level of the digital signal DAC is set to a "High" level. As described above, the division ratio of the dividing circuit 103a is also set according to the assist boundary value Va.

FIG. 12 is a table showing an example of a relationship between the output voltage (erase voltage) VERA and the setting value DACV. As shown in FIG. 12, the setting value DACV is represented by 3 bits <2:0>. For example, if the assist boundary value Va is set to 14 V, the output voltage VERA can be identified by B<2>. Therefore, the digital signal DACV that is input to the pump switching detecting circuit 103 corresponds to B<2>.

Next, an example of the erase operation of the memory cell M of the semiconductor storage device that has the above configuration will be described.

First, a first output voltage VERA_INIT of the output voltage VERA is set by the setting value DACV. A level of the assist boundary value Va can be determined in advance in a design step. In this embodiment, the output voltage VERA_INIT is always more than the assist boundary value Va. For example, if the assist boundary value Va is set to 7 V and the output voltage VEA_INIT is set to 14 V by the setting value DACV (refer to FIG. 11), the output voltage VERA exceeds the assist boundary value Va=7 V. The detection circuit output is switched as a logical signal and a level of the digital signal DAC is set to a "High" level.

At the time of the erase operation of the memory cell M, when the output voltage VERA is less than the predetermined assist boundary value Va, the pump switching detecting circuit 103 performs a boosting operation on the low voltage generating pump circuit 101 using the assist signal VMASSIST ("High" level) and outputs the boosting voltage to the output terminal 106.

In this case, the flag signal FLG that is output by the amplifier circuit 103b of the pump switching detecting circuit 103 is set such that a level thereof becomes a "High" level, when the amplifier circuit 103b is in a disabled state. That is, when the output voltage VERA is boosted and the output voltage does not reach the assist boundary value Va, the flag signal FLG is controlled such that the level thereof becomes a "High" level. When the output voltage reaches the assist boundary value Va, the flag signal FLG is controlled such that the level thereof becomes a "Low" level.

As such, during the initial boosting operation, the output voltage VERA does not reach the assist boundary value Va. Therefore, the level of the flag signal FLG becomes a "High" level and the level of the assist signal VMASSIST becomes a "High" level, such that the low voltage generating pump circuit 101 is operated.

Meanwhile, if the output voltage VERA becomes the assist boundary value or more, the level of the flag signal FLG that is output by the amplifier circuit 103b becomes a "Low" level. Thereby, the pump switching detecting circuit 103 outputs the assist signal VMASSIST ("Low" level). According to the assist signal VMASSIST, the low voltage generating pump circuit 101 is inactivated and the boosting operation is stopped. The high voltage generating pump circuit 102 is activated and the boosting operation starts.

By performing the switching control on the plural pump circuits according to the voltages generated in the above-described way, a boosting operation can be realized with superior power efficiency.

As described above, the erase pulse control circuit 104 sets the target values of the low voltage generating pump circuit 101 and the high voltage generating pump circuit 102 to be increased stepwisely, on the basis of the setting values DACV, Δvera, tpulse, and Sn.

Thereby, the output voltage VERA that is output from the low voltage generating pump circuit 101 or the high voltage generating pump circuit 102 to be activated and is increased stepwisely is applied from the output terminal 106 to the wells Well (p) and Well (n).

At the time of the erase operation of the memory cell M, the potential of the control gate CG of the memory cell M that is formed on the floating gate G through the insulating film is set to the fixed potential (ground potential).

Thereby, the erase voltage VERA to be increased stepwisely is applied to the wells Well (p) and Well (n) and the potentials of the Well (p) and the Well (p) become higher than the potential of the floating gate FG. Therefore, the charges that are accumulated in the floating gate FG flow to the wells Well (p) and Well (n) through the tunnel insulating film (data that is stored in the memory cell M is erased).

Figure 13:
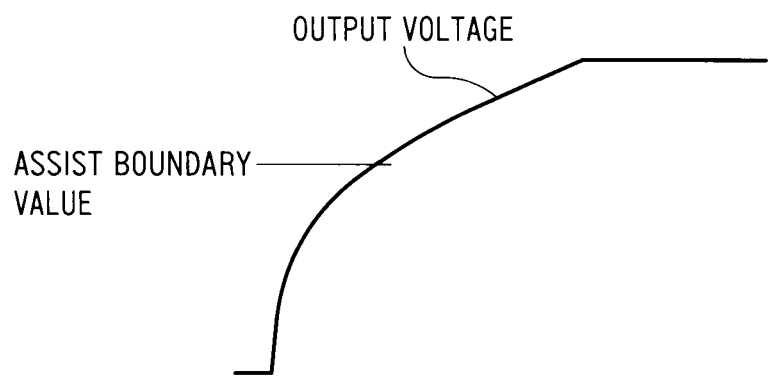
FIG. 13 shows the waveform of the output voltage VERA and the assist boundary value Va when the number of steps of the output voltage VERA is 1.
Figure 14:
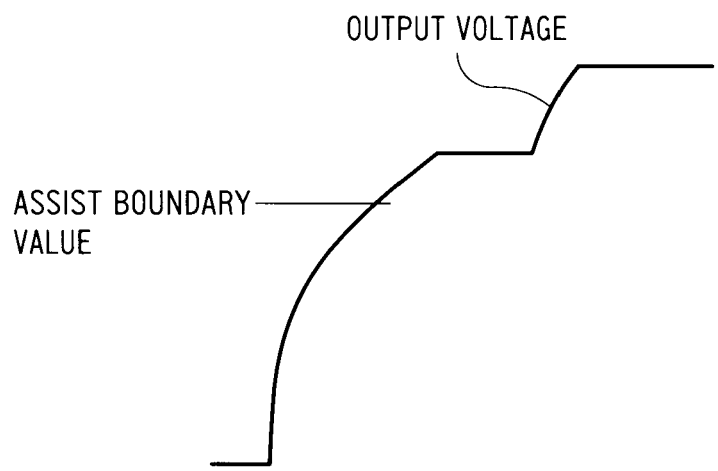
FIG. 14 shows the waveform of the output voltage VERA and the assist boundary value Va when the number of steps of the output voltage VERA is 2.

FIG. 13 shows the waveform of the output voltage VERA and the assist boundary value Va when the number of steps of the output voltage VERA is 1. FIG. 14 shows the waveform of the output voltage VERA and the assist boundary value Va when the number of steps of the output voltage VERA is 2. As shown in FIGS. 13 and 14, the pump switching detecting circuit 103 can switch the low voltage generating pump circuit 101 and the high voltage generating pump circuit 102, on the basis of the assist boundary value Va.

Referring to FIG. 14, an effect that is obtained by stepwisely increasing the output voltage (erase voltage) VERA will be described below. In general, a variation exists in the threshold values of the plural memory cells M that become erase objects. In the floating gate FG of the memory cell M where the threshold value is largest, a large amount of electrons are accumulated. In this memory cell M, the highest electric field is applied to the tunnel insulating film at the time of erasure. Meanwhile, in the memory cell M that has the smallest threshold value, the lowest electric field is applied.

Therefore, in order to increase the erasure speed, the erasure voltage needs to be set according to the memory cell M where the electric field is lowest. The highest electric field is applied to the memory cell M that has the thin tunnel insulating film. Thereby, the excessive electric field stress may be applied to the memory cell M where the erasure speed is high, by the memory cell M where the erasure speed is low. That is, if the write/erasure operation is repeated, the memory cell M where the erasure speed is high may be deteriorated earlier than the memory cell M where the erasure speed is low.

Meanwhile, the semiconductor storage device according to this embodiment stepwisely increases the output voltage (erasure voltage) VERA that is applied to the well at the time of the erasure. Thereby, with respect to the memory cell M where the erasure speed is high, the strength of the electric field that is applied to the tunnel insulating film decreases, and generation of a defect in the tunnel insulating film can be suppressed. As such, according to the semiconductor storage device according to this embodiment, the reliability can be suppressed from being deteriorated due to the repetition of the write/erasure operation.

After the first erasure operation based on the output voltage (erasure voltage) VERA to be increased stepwisely, a read operation (verification and read) to determine whether data of the memory cell M is sufficiently erased is executed. When the data of the memory cell M is not sufficiently erased, the second erase operation based on the output voltage (erasure voltage) VERA to be increased stepwisely may be executed. In this case, in order to reduce an erasure time, an initial voltage of the output voltage (erasure voltage) VERA in the second erasure operation may be set to become higher than the initial voltage in the first erasure operation, by changing the initial value verai.

Likewise, after the second erasure operation based on the output voltage (erasure voltage) VERA to be increased stepwisely, if the data of the memory cell M is not sufficiently erased, the third erase operation based on the output voltage (erasure voltage) VERA to be increased stepwisely may be executed. The number of steps in the N-th (N is a natural number of 2 or more) erasure operation may be smaller than the number of steps in the (N−1)-th erasure operation. For example, in the second and following erasure operations after the first erasure operation based on the output voltage (erasure voltage) VERA to be increased stepwisely, the number of steps in the output voltage (erasure voltage) VERA may be one.

The assist boundary value Va is set to switch the pump circuit with boosting of two steps to reduce the rising time of the output voltage VERA. In the first step, if the output voltage exceeds the predetermined assist boundary value Va when the pump circuit having the characteristic of the low output voltage and the high output current is used, the pump circuit having the characteristic of the high output voltage and the low output current is operated. At this time, when the output voltage VERA is less than the assist boundary value Va, the high voltage generating pump circuit may be operated together with the low voltage generating pump circuit or may be controlled independently from the low voltage generating pump circuit. Likewise, when the output voltage VERA is equal to or more than the assist boundary value Va, the low voltage generating pump circuit may be controlled independently.

Second Embodiment

Figure 15:
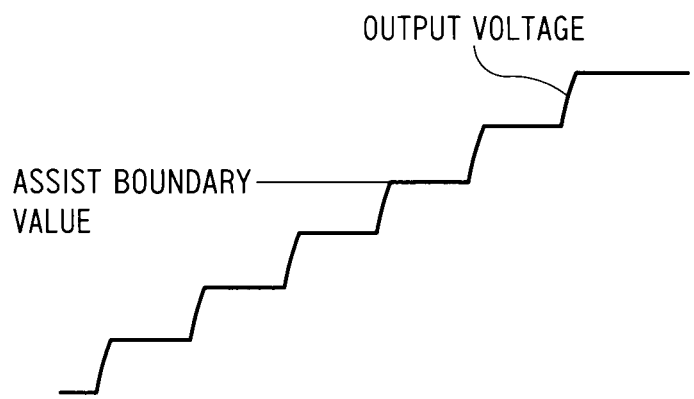
FIG. 15 shows a waveform of the output voltage VERA and the assist boundary value Va when the number of steps in the output voltage VERA is 6.

FIG. 15 shows a waveform of the output voltage VERA and the assist boundary value Va when the number of steps in the output voltage VERA is 6. For example, in the pump switching detecting circuit 103 according to the first embodiment, the flag signal FLG reacts once until the output voltage VERA reaches the assist boundary value Va. If the level of the flag signal FLA becomes a "Low" level, the flip-flop circuit 103c is reset. Then, even though the output voltage VERA is boosted, the assist signal VMASSIST maintains a "Low" level and an assist function is disabled. For example, if the level of the flag signal FLA becomes the "Low" level in the first step, the output voltage VERA is boosted to the assist boundary value Va by the high voltage generating pump circuit and power efficiency is deteriorated.

Figure 16:
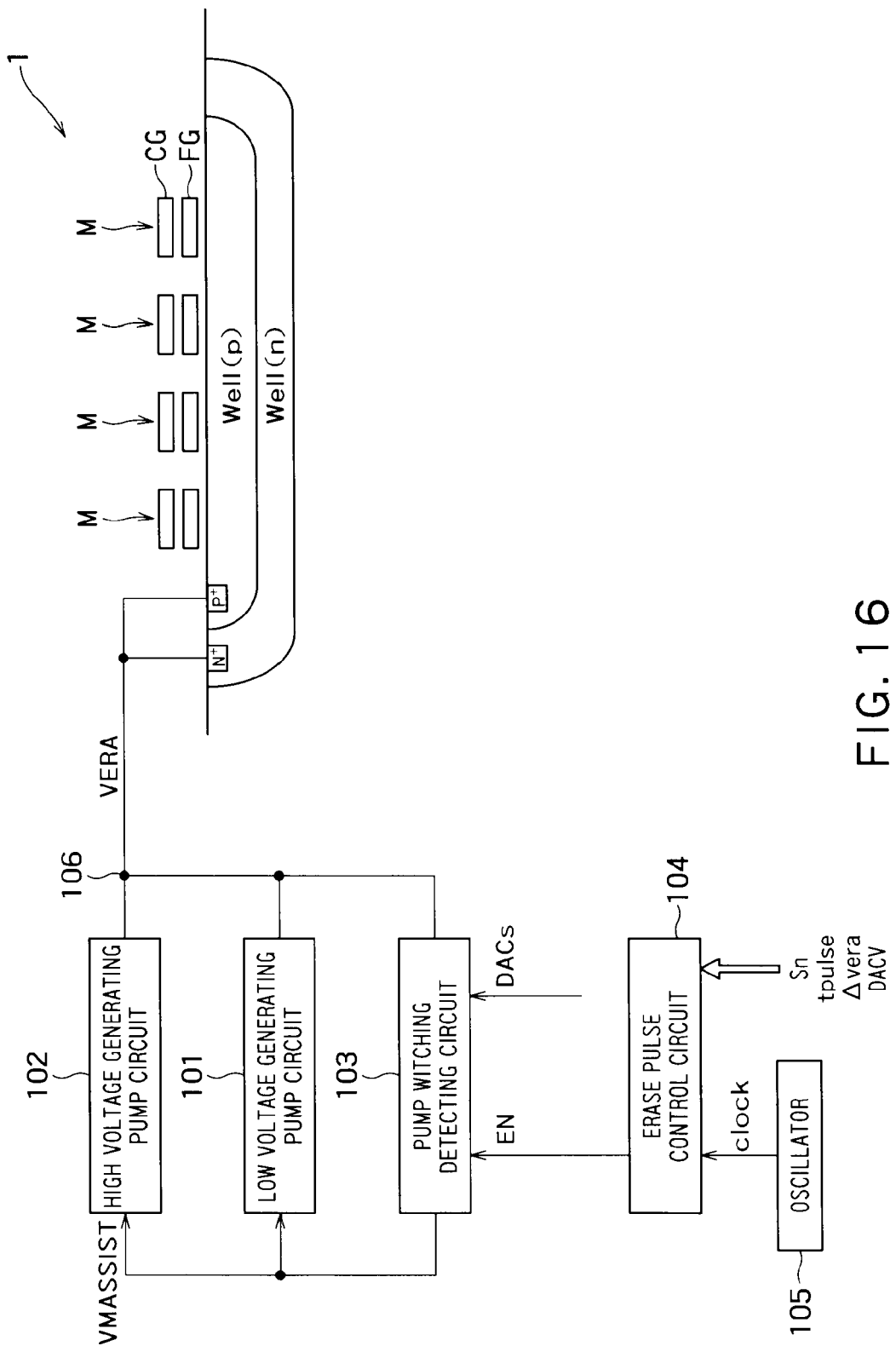
FIG. 16 shows a part of the configuration of the control circuit 7 and a part of a section of the memory cell array 1.

Therefore, in the second embodiment, the configuration that improves the above point will be described. FIG. 16 shows a part of the configuration of the control circuit 7 and a part of a section of the memory cell array 1. In FIG. 16, the same reference numerals as those of FIG. 5 denote the same components as those of the first embodiment.

As shown in FIG. 16, the control circuit 7 has a low voltage generating pump circuit (first pump circuit) 101, a high voltage generating pump circuit (second pump circuit) 102, a pump switching detecting circuit 103, an erase pulse control circuit 104, an oscillator 105, and an output terminal 106. That is, the entire configuration as that of FIG. 16 is the same as that of the first embodiment.

Similar to the first embodiment, the pump switching detecting circuit 103 outputs an assist signal VMASSIST to perform a boosting operation on at least one of the low voltage generating pump circuit 101 and the high voltage generating pump circuit 102. To the pump switching detecting circuit 103, a digital signal DACs according to a predetermined assist boundary value Va is input. The digital signal DACs is different from that of the first embodiment. For example, the digital signal DACs is generated by decoding 3-bit data stored in a ROM fuse by a decode circuit (not shown in the drawings).

Similar to the first embodiment, when the output voltage VERA is less than the assist boundary value Va, the pump switching detecting circuit 103 performs a boosting operation on the low voltage generating pump circuit 101 using the assist signal VMASSIST and outputs a boosting voltage to the output terminal 106. Meanwhile, when the output voltage VERA is equal to or more than the assist boundary value Va, the pump switching detecting circuit 103 performs a boosting operation on the high voltage generating pump circuit 102 using the assist signal VMASSIST and outputs a boosting voltage to the output terminal 106.

Figure 17:
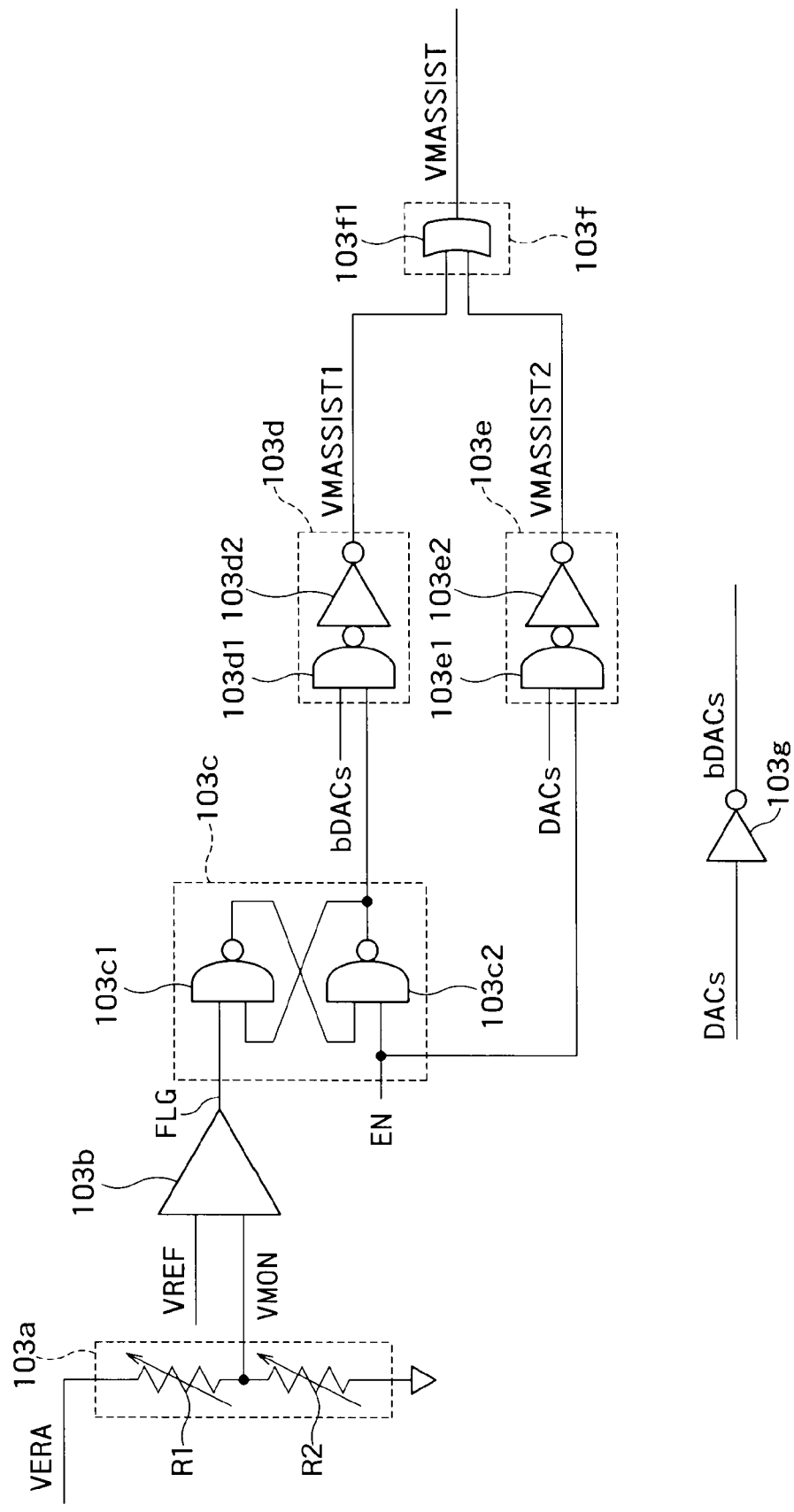
FIG. 17 is a circuit diagram showing an example of the circuit configuration of the pump switching detecting circuit 103 shown in FIG. 16.
Figure 18:
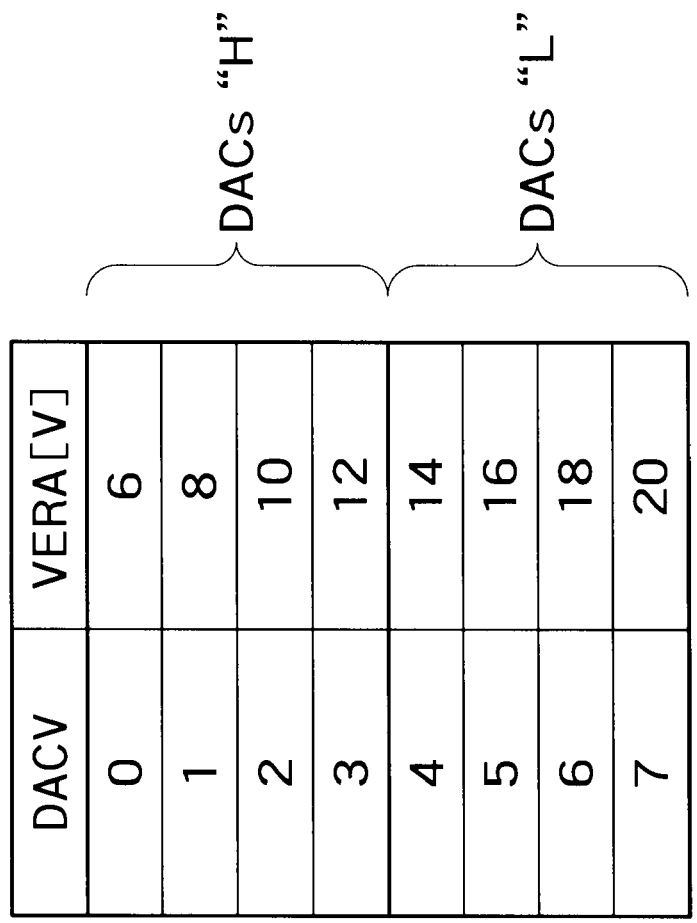
FIG. 18 is a table showing an example of a relationship between the output voltage (erase voltage) VERA and the setting value DACV.

FIG. 17 is a circuit diagram showing an example of the circuit configuration of the pump switching detecting circuit 103 shown in FIG. 16. FIG. 18 is a table showing an example of a relationship between the output voltage (erase voltage) VERA and the setting value DACV. In FIG. 17, the same reference numerals as those of FIG. 10 denote the same components as those of the first embodiment.

As shown in FIG. 17, the pump switching detecting circuit 103 has a dividing circuit 103a, an amplifier circuit 103b, a flip-flop circuit (SR-type flip-flop circuit) 103c, logic circuits 103d to 103f, and an inverter 103g. That is, the pump switching detecting circuit 103 according to the second embodiment further has the logic circuits 103e and 103f and the inverter 103g, as compared with the configuration of the first embodiment.

A digital signal DACs is input to the inverter 103g and the inverter 103g outputs an inverted digital signal bDACs of the digital signal DACs.

The logic circuit 103d outputs an assist signal VMASSIST that is obtained by operating an output of the flip-flop circuit 103c and the digital signal bDACs according to the assist boundary value Va.

The logic circuit 103d includes a NAND circuit 103d1 to which outputs of the digital signal bDACs and the flip-flop circuit 103c are input and an inverter 103d2 to which an output of the NAND circuit 103d1 is input and which outputs the assist signal VMASSIST.

The logic circuit 103e outputs an assist signal VMASSIST2 that is obtained by operating an enable signal EN and the digital signal DACs.

The logic circuit 103e includes a NAND circuit 103e1 to which outputs of the digital signal DACs and the flip-flop circuit 103c are input and an inverter 103e2 to which an output of the NAND circuit 103e1 is input and which outputs the assist signal VMASSIST2.

The logic circuit 103f outputs an assist signal VMASSIST that is obtained by operating the output signal VMASSIST1 of the logic circuit 103d and the output signal VMASSIST2 of the logic circuit 103e.

The logic circuit 103f includes an OR circuit 103f to which outputs of the inverter 103d2 and the inverter 103e2 are input and which outputs the assist signal VMASSIST obtained by operating these signals.

For example, if the assist boundary value Va is set to 14 V, a level of the digital signal DACs is set to a "Low" level. As described above, the division ratio of the dividing circuit 103a is also set according to the assist boundary value Va.

Next, an example of the erase operation of the memory cell M of the semiconductor storage device that has the above configuration will be described.

First, setting values DACV, Sn, and Δvera to determine a target value of the output voltage VERA are set, the corresponding signal is decoded in the analog circuit, and the assist boundary value Va is determined. For example, as described above, if the assist boundary value Va is set to 14 V, a level of the digital signal DACs is set to a "Low" level.

At the time of the erase operation of the memory cell M, when the output voltage VERA is less than the predetermined assist boundary value Va, the pump switching detecting circuit 103 performs a boosting operation on the low voltage generating pump circuit 101 using the assist signal VMASSIST ("High" level) and outputs the boosting voltage to the output terminal 106.

That is, if the output voltage VERA is equal to or less than 12 V, the level of the assist signal VMASSIST also becomes a "High" level. Meanwhile, the output voltage VERA is equal to or more than 14 V, the level of the signal VMASSIST1 becomes a "High" level and the level of the assist signal VMASSIST becomes a "High" level. Thereby, even in the case shown in FIG. 15, the voltage of the low voltage generating pump circuit 101 can be boosted to the assist boundary value Va. By performing this control, power efficiency can be improved.

Similar to the first embodiment, as described above, the erase pulse control circuit 104 sets the target voltages of the low voltage generating pump circuit 101 and the high voltage generating pump circuit 102 to be increased stepwisely, on the basis of the setting values DACV, Δvera, tpulse, and Sn.

Thereby, the erasure voltage VERA to be increased stepwisely is applied to the wells Well (p) and Well (n), and the potentials of the wells Well (p) and Well (n) become higher than the potential of the floating gate FG. Therefore, the charges that are accumulated in the floating gate FG flow to the wells Well (p) and Well (n) through the tunnel insulating film (data that is stored in the memory cell M is erased).

As such, the strength of the electric field that is applied to the tunnel insulating film decreases, and generation of a defect in the tunnel insulating film can be suppressed. Therefore, the reliability can be suppressed from being deteriorated due to the repetition of the write/erasure operation.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor storage device, comprising:
   a plurality of memory cells which electrically will rewrite data;
   a well control circuit configured to output an erasure voltage to be applied to the well;
   a first pump circuit configured to output a voltage set by boosting an input voltage to the well control circuit;
   a second pump circuit configured to output a voltage set by boosting the input voltage to the well control circuit and output a voltage higher than that of the first pump circuit;
   a pump switching detecting circuit configured to output an assist signal to perform a boosting operation on at least one of the first pump circuit and the second pump circuit; and
   an erase pulse control circuit configured to set target voltages of the first pump circuit and the second pump circuit,
   wherein, in the erasure operation, when the erasure voltage is less than an assist boundary value, the pump switching detecting circuit performs the boosting operation on the first pump circuit on the basis of the assist signal and outputs the boosting voltage, and when the erasure voltage is equal to or more than the assist boundary value, the pump switching detecting circuit performs the boosting operation on the second pump circuit on the basis of the assist signal and outputs a boosting voltage,
   the erasure pulse control circuit sets the target voltages of the first pump circuit and the second pump circuit to be increased stepwisely, on the basis of the setting values to set the target voltages, and
   the well control circuit applies the erasure voltage that is output from the first pump circuit or the second pump circuit to be activated and is increased stepwisely to the well.

2. The semiconductor storage device according to claim 1, wherein the pump switching detecting circuit comprises:
   a dividing circuit configured to set a division ratio on the basis of the assist boundary value and to output a first voltage obtained by dividing the erasure voltage,
   an amplifier circuit configured to compare the first voltage and a reference voltage and output a flag signal on the basis of the comparison result,
   a flip-flop circuit in which the flag signal is input to a set terminal and an enable signal to start an operation is input to a reset terminal, and
   a logic circuit configured to output the assist signal operated by an output of the flip-flop circuit and a digital signal on the basis of the assist boundary value.

3. The semiconductor storage device according to claim 1, wherein the pump switching detecting circuit comprises:
   a dividing circuit configured to set a division ratio on the basis of the assist boundary value and to output a first voltage obtained by dividing the erasure voltage,
   an amplifier circuit configured to compare the first voltage and a reference voltage and outputs a flag signal on the basis of the comparison result,
   a flip-flop circuit in which the flag signal is input to a set terminal and an enable signal to start an operation is input to a reset terminal,
   a first logic circuit configured to output a signal operated by an output of the flip-flop circuit and a first digital signal on the basis of the assist boundary value,
   a second logic circuit configured to output a signal operated by the enable signal and a second digital signal inverting the first digital signal, and
   a third logic circuit configured to output the assist signal operated by an output of the first logic circuit and an output of the second logic circuit.

4. The semiconductor storage device according to claim 2, wherein
   the logic circuit comprises
   a NAND circuit to which outputs of the digital signal and the flip-flop circuit are input, and
   an inverter to which an output of the NAND circuit is input and which outputs the assist signal.

5. The semiconductor storage device according to claim 3, wherein
   the first logic circuit comprises a first NAND circuit to which outputs of the digital signal and the flip-flop circuit are input, and an first inverter to which an output of the first NAND circuit is input,
   the second logic circuit comprises a second NAND circuit to which the enable signal and the second digital signal are input, and an second inverter to which an output of the second NAND circuit is input, and
   the third logic circuit comprises a OR circuit to which outputs of the first inverter and the second inverter are input, the OR circuit outputting the assist signal.

6. The semiconductor storage device according to claim 1, wherein an output current of the first pump circuit is larger than an output current of the second pump circuit.

7. The semiconductor storage device according to claim 2, wherein an output current of the first pump circuit is larger than an output current of the second pump circuit.

8. The semiconductor storage device according to claim 3, wherein an output current of the first pump circuit is larger than an output current of the second pump circuit.

9. The semiconductor storage device according to claim 4, wherein an output current of the first pump circuit is larger than an output current of the second pump circuit.

10. The semiconductor storage device according to claim 5, wherein an output current of the first pump circuit is larger than an output current of the second pump circuit.

11. The semiconductor storage device according to claim 1, wherein, in the erasure operation of the memory cell, a potential of a control gate of the memory cell is set to a fixed potential, the control gate being formed on a charge accumulation layer through an insulating film.

12. The semiconductor storage device according to claim 2, wherein, in the erasure operation of the memory cell, a potential of a control gate of the memory cell is set to a fixed potential, the control gate being formed on a charge accumulation layer through an insulating film.

13. The semiconductor storage device according to claim 3, wherein, in the erasure operation of the memory cell, a potential of a control gate of the memory cell is set to a fixed potential, the control gate being formed on a charge accumulation layer through an insulating film.

14. The semiconductor storage device according to claim 4, wherein, in the erasure operation of the memory cell, a potential of a control gate of the memory cell is set to a fixed potential, the control gate being formed on a charge accumulation layer through an insulating film.

15. The semiconductor storage device according to claim 5, wherein, in the erasure operation of the memory cell, a potential of a control gate of the memory cell is set to a fixed potential, the control gate being formed on a charge accumulation layer through an insulating film.

16. The semiconductor storage device according to claim 6, wherein, in the erasure operation of the memory cell, a potential of a control gate of the memory cell is set to a fixed potential, the control gate being formed on a charge accumulation layer through an insulating film.

17. The semiconductor storage device according to claim 11, wherein the fixed potential is a ground voltage.

18. The semiconductor storage device according to claim 1, wherein the semiconductor storage device is a NAND-type flash memory.

19. The semiconductor storage device according to claim 1, wherein the erase pulse control circuit comprises:
a timer which counts a clock signal and outputs a first count value,
a first comparison circuit which compares the first count value output and a predetermined pulse time, and which outputs a first signal, when the first count value and the pulse time are matched with each other,
a counter which counts the first signal and outputs a second count value,
a second comparison circuit which outputs a second signal to stop boosting operations of the first and second pump circuits when the second count value is matched with a predetermined step number,
a multiplexer which outputs a first setting value according to the first signal,
an adder which adds a control value and the first setting value from the multiplexer and outputs an added value, the control value being used for controlling the target voltages of the first and second pump circuits, and
a flip-flop circuit which the clock signal clock is input to a C terminal thereof and an operation result of the adder is input to a D terminal thereof, and which outputs a latched value as the control value in synchronization with the clock signal.

20. The semiconductor storage device according to claim 18, wherein the erase pulse control circuit comprises:
a timer which counts a clock signal and outputs a first count value,
a first comparison circuit which compares the first count value output and a predetermined pulse time, and which outputs a first signal, when the first count value and the pulse time are matched with each other,
a counter which counts the first signal and outputs a second count value,
a second comparison circuit which outputs a second signal to stop boosting operations of the first and second pump circuits when the second count value is matched with a predetermined step number,
a multiplexer which outputs a first setting value according to the first signal,
an adder which adds a control value and the first setting value from the multiplexer and outputs an added value, the control value being used for controlling the target voltages of the first and second pump circuits, and
a flip-flop circuit which the clock signal clock is input to a C terminal thereof and an operation result of the adder is input to a D terminal thereof, and which outputs a latched value as the control value in synchronization with the clock signal.

* * * * *